United States Patent [19]

Sugishita et al.

[11] 4,424,251
[45] Jan. 3, 1984

[54] THICK-FILM MULTI-LAYER WIRING BOARD

[75] Inventors: Nobuyuki Sugishita, Yokosuka; Akira Ikegami, Yokohama, both of Japan

[73] Assignee: Hitachi, Ltd., Tokyo, Japan

[21] Appl. No.: 287,683

[22] Filed: Jul. 28, 1981

[30] Foreign Application Priority Data

Jul. 28, 1980 [JP] Japan .......................... 55-105728[U]

[51] Int. Cl.³ .............................................. H05K 3/46
[52] U.S. Cl. .................................. 428/209; 174/68.5;
338/308; 361/410; 361/411; 428/210,427;
428/428; 428/432; 428/901; 428/701
[58] Field of Search ...................... 252/519, 514, 511;
428/209, 210, 428, 427, 901, 701, 432, 433, 434;
338/308; 427/96, 103, 101, 102; 174/68.5;
361/410, 411

[56] References Cited

U.S. PATENT DOCUMENTS

| | | | |
|---|---|---|---|
| 3,576,668 | 4/1971 | Fenster | 428/901 |
| 3,878,443 | 4/1975 | Girard | 252/514 |
| 4,256,796 | 3/1981 | Haug | 428/433 |

*Primary Examiner*—Ellis P. Robinson
*Attorney, Agent, or Firm*—Antonelli, Terry & Wands

[57] ABSTRACT

A thick-film multi-layer wiring board in which the thick-film resistor provided in the inner layer is coated with a glass material selected from (a) and (b) below:

(a) crystallized glass which is crystallized at 850° C. or above, and (b) amorphous glass having a softening temperature of 750° C. or above and composed of glass and at least one refractory oxide selected from $Al_2O_3$ and $SiO_2$.

24 Claims, 5 Drawing Figures

THICK-FILM MULTI-LAYER WIRING BOARD

BACKGROUND OF THE INVENTION

1. Field of the Invention

This invention relates to a thick-film multi-layer wiring board adapted for high-density mounting.

2. Description of the Prior Art

Hitherto, the thick-film multi-layer wiring boards for high-density mounting have been produced from the following steps (a) to (f):

(a) printing a first conductor pattern on the surface of a ceramic substrate, (b) drying and baking said first conductor pattern, (c) printing a hard glass (high-softening point amorphous glass) insulation pattern on the whole surface of said substrate and said conductor pattern and perforating the section where said conductor pattern is to be contacted with other conductor layer during printing of said insulation pattern, (d) drying and baking said glass insulation pattern, (e) printing other conductor layers according to the predetermined patterns and effecting contact of the respective conductor layers by allowing the conductor to flow into the holes in said glass insulation layer, and (f) drying and baking said final layer.

The thick-film multi-layer wiring boards mounted with thick-film resistors have been produced by further incorporating the steps of printing, drying and baking a resistor paste between said steps (b) and (c). However, in the production of the thick-film multi-layer wiring boards mounted with thick-film resistors according to such process, the binder glass in the thick-film resistors would react with the hard glass insulation layer during baking of the glass insulation layer to cause a change in resistivity of the thick-film resistors, making it difficult to invariably obtain desired resistivities.

For this reason, the thick-film multi-layer wiring boards mounted with high-precision thick-film resistors available in the prior art have been necessarily limited to those in which the thick-film resistors is provided only in the uppermost layer, and high-density mounting was hardly possible with such wiring boards.

SUMMARY OF THE INVENTION

The principal object of this invention is to eliminate said problems of the prior art and to provide a thick-film multi-layer wiring board capable of high-density mounting of high-precision thick-film resistors.

The above object of the invention can be accomplished by forming the insulating layers provided on each conductor layer and thick-film resistance from an insulating material which is sparingly reactive to binder glass in said conductor layer and thick-film resistance to minimize the variation in resistivity of the thick-film resistors.

More definitely, said object can be attained by forming said insulating layers with a glass material selected from the following types of glass (a) and (b):

(a) Crystallized glass having a crystallization temperature of 850° C. or above, preferably 850° to 950° C.

(b) Amorphous glass having a softening temperature of 750° C. or above, preferably 750° to 900° C., and composed of glass and at least one refractory oxide selected from $Al_2O_3$ and $SiO_2$.

DESCRIPTION OF THE PREFERRED EMBODIMENTS

Figure 1:
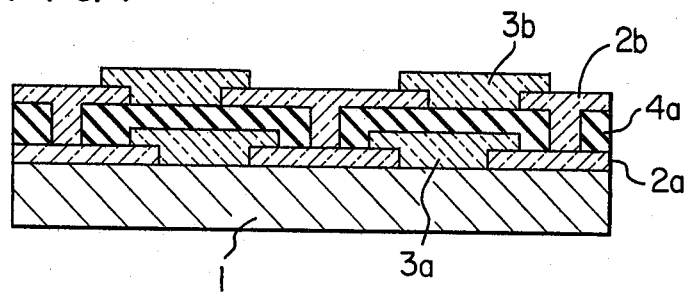
FIGS. 1 and 5 are sectional views of the thick-film multi-layer wiring boards according to this invention.

First, the materials used in this invention and their treating conditions are described.

(a) Insulating layer materials and their treating conditions

Used for the insulating layer is (i) a glass paste comprising crystallized glass powder composed of $BaO$-$ZnO$-$MgO$-$Al_2O_3$-$TiO_2$-$SiO_2$-$B_2O_3$ and crystallized at 850° C. or above, a vehicle and a solvent (4608 by ESL is a typical example of this type of glass paste), (ii) a glass paste comprising crystallized glass powder composed of a mixture of $PbO$-$CaO$-$MgO$-$Al_2O_3$-$SiO_2$-$B_2O_3$ glass powder, $Al_2O_3$ powder (filler) and $CaZrO_3$ powder (crystal nucleus) and crystallized at 850° C. or above, a vehicle and a solvent (9950 by Du Point belongs to this type of glass paste), or (iii) a glass paste comprising amorphous glass powder composed of a mixture of $PbO$-$CaO$-$Al_2O_3$-$SiO_2$-$B_2O_3$ glass powder and at least one of $Al_2O_3$ powder (filler) and $SiO_2$ powder (filler) and softened at 750° C. or above, a vehicle and a solvent (ESL's 4901-$H_5$ is an example of such glass paste). These glass pastes are usually screen-printed. The film is dried at 120° to 150° C. and baked at 850° C. or above. Those having a crystallization temperature of 850°–950° C. and a softening temperature of 750° to 850° C. and baked at 850° to 950° C.

(b) Thick-film resistor materials and their treating conditions

Used for the thick-film resistance is a resistor paste selected from: (i) a resistor paste composed of $RuO_2$ conductive powder, $PbO$-$ZnO$-$Al_2O_3$-$SiO_2$-$B_2O_3$ glass powder, a vehicle and a solvent (for example, it comprises 66 to 75% by weight of a mixture consisting of 30–90 wt% of glass powder having a composition of 40–70 wt% $PbO$, 1–5 wt% $ZnO$, 3–10 wt% $Al_2O_3$, 30–40 wt% $SiO_2$ and 5–15 wt% $B_2O_3$ and 70–10 wt% of $RuO_2$ powder, 2.5 to 3.5% by weight of a vehicle and 20 to 30% by weight of a solvent) and having a baking temperature of 850° C. or above, (ii) a resistor plate composed of $RuO_2$ conductive powder, $PbO$-$CdO$-$Al_2O_3$-$SiO_2$-$B_2O_3$ glass powder, a vehicle and a solvent (for example, it comprises 65 to 75% by weight of a mixture consisting of 30–90 wt% of glass powder having a composition of 40–70 wt% $PbO$, 1–5 wt% $CdO$, 3–10 wt% $Al_2O_3$, 30–40 wt% $SiO_2$ and 5–15 wt% $B_2O_3$ and 70–30 wt% of $RuO_2$ powder, 2.5 to 3.5% by weight of a vehicle and 20 to 30% by weight of a solvent) and having a baking temperature of 850° C. or above, (iii) a resistor paste composed of $Bi_2Ru_2O_7$ conductive powder, $PbO$-$ZnO$-$Al_2O_3$-$SiO_2$-$B_2O_3$ glass powder, a vehicle and a solvent (for example, it comprises 65 to 75% by weight of a mixture consisting of 30–90 wt% of glass of the same composition as in (i) above and 70–10 wt% of $Bi_2Ru_2O_7$, 2.5 to 3.5% by weight of a vehicle and 20 to 30% by weight of a solvent) and having a baking temperature of 850° C. or above, and (iv) a resistor paste composed of $Bi_2Ru_2O_7$ conductive powder, $PbO$-$CdO$-

Al$_2$O$_3$-SiO$_2$-B$_2$O$_3$ glass powder, a vehicle and a solvent (for example, it comprises 65 to 75% by weeight of a mixture consisting of 30-90 wt% of glass of the same composition as in (ii) above and 70-10 wt% of Bi$_2$-Bu$_2$O$_7$, 2.5 to 3.5% by weight of a vehicle and 20 to 30% by weight of a solvent) and having a baking temperature of 850° C. or above. These resistor pastes are usually screen printed, and the film is dried at 120° to 150° C. and baked at 850° C. or above. Practically, however, the baking temperature is preferably from 850° to 950° C.

(c) Conductor materials and their treating conditions

There is used a conductor paste prepared by blending for example 80 to 90% by weight of powder of at least one metal selected from Ag, Au, Pd and Pt or powder of at least one alloy selected from Ag alloy, Au alloy, Pd alloy and Pt alloy, for example 65 to 75% by weight of glass having for example 20-10% by weight of glass frit blended therein, for example 2.5 to 3.5% by weight of a vehicle and for example 20 to 30% by weight of a solvent. Such conductive paste is usually applied by screen printing, and the film is dried at 120° to 150° C. and baked at 850° C. or above, preferably 850° to 950° C.

The present invention is further described below by way of the embodiments thereof.

EXAMPLE 1

(I) As shown in FIG. 1, an Ag-Pd conductive paste (TR-4846 by Tanaka Massei KK) was screen-printed on a 96% alumina-made ceramic substrate 1, dried at 130° C. for 10 minutes and baked at 900° C. for 10 minutes to obtain a first layer conductor 2a.

Then a RuO$_2$ resistor paste (composed of RuO$_2$ powder, PbO-ZnO-Al$_2$O$_3$-SiO$_2$-B$_2$O$_3$ glass, a vehicle and a solvent) having a sheet resistivity of $10^3$ Ω/□ was screen-printed and dried at 130° C. for 10 minutes to form a dried first layer thick-film resistor, and further Glass Paste 9950 by Du Pont (using a crystallized glass having a solftening temperature of 880° C. and a crystallization temperature of 915° C.) was screen-printed and dried at 130° C. for 10 minutes to form a dry insulating layer, followed by 10-minute heating at 900° C. to obtain a first layer thick-film resistor 3a and an insulating layer 4a.

In order to know whether said first layer thick-film resistor is reacted with the insulating layer to cause a change in sheet resistivity during baking, the rate of change of sheet resistivity in said resistor as against that in the thick-film resistor of a wiring board having only the first layer conductor and first layer thick-film resistor formed on the ceramic substrate was determined. The results are shown through No. 1 in Table 1.

TABLE 1

| No. | Commercial name | Type of insulating layer | | | Rate of change of resistivity (%) | Remarks |
| --- | --- | --- | --- | --- | --- | --- |
| | | Baking temp. (°C.) | Softening temp. (°C.) | Crystallization temp. (°C.) | | |
| 1 | Du Pont 9950 | 900 | 890 | 915 | +6 | Crystalline glass |
| 2 | ESL 4608 | 850 | 780 | 858 | +30 | Crystalline glass |
| 3 | ESL 4901-H$_5$ | 900 | 820 | — | −9 | Amorphous glass |
| 4 | Du Pont 9429 | 850 | 670 | 790 | +233 | Conventional product |

$$\text{Rate of change of sheet resistivity (\%)} = \frac{\left(\begin{array}{l}\text{sheet resistivity}\\(\Omega/\square) \text{ on the thick-}\\ \text{film resistor coated}\\ \text{with insulating}\\ \text{layer}\end{array}\right) - \left(\begin{array}{l}\text{sheet resistivity } (\Omega/\square)\\ \text{of the thick-film}\\ \text{resistor not coated}\\ \text{with insulating}\\ \text{layer}\end{array}\right)}{\text{sheet resistivity } (\Omega/\square) \text{ of the thick-film resistor not coated with insulating layer}} \times 100$$

It will be seen that the rate of change of sheet resistivity in the product of this invention is strikingly low as compared with that in the thick-film resistor coated with conventional glass (No. 4 in Table 1). This indicates that the glass materials of Nos. 1 to 3 in Table 1 are sparingly reactive to the resistor.

Figure 2:
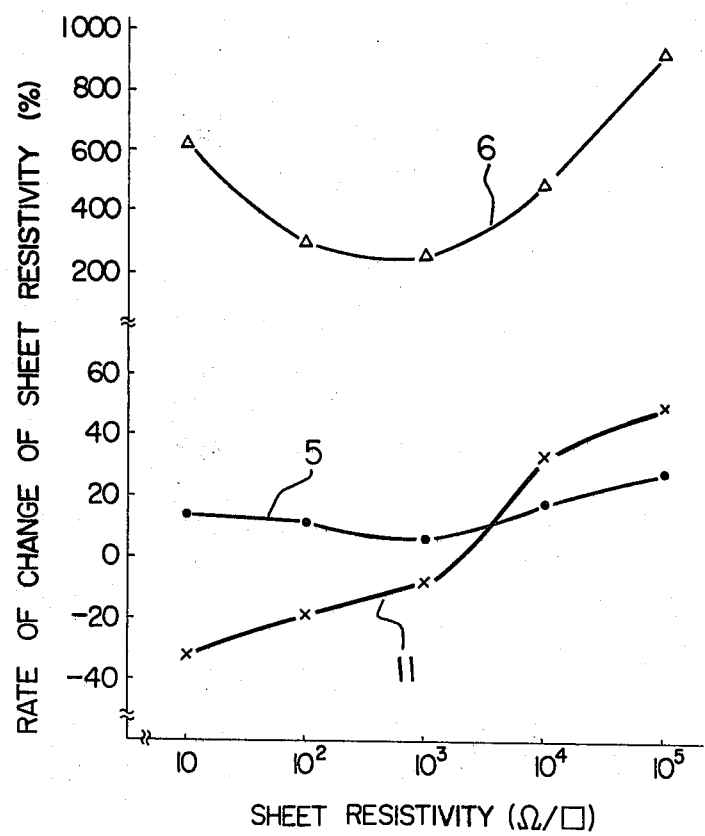
FIGS. 2 to 4 show variation in sheet resistivity of the thick-film resistors in the various sheets coated with the glass materials according to this invention and the glasses of the prior art.

(II) There were formed the first layer thick-film resistors, one of which was coated with an insulating layer and the other not coated, in the same way as in (I) above except for use of a RuO$_2$ resistor paste having a sheet resistivity of 10 Ω/□ to $10^5$ Ω/□ for the thick-film resistor, and the rate of change of sheet resistivity was similarly determined. The results were as indicated by the curves 5 and 6 in FIG. 2. It will be noted that the rate of change of resistivity in the thick-film resistor coated with a glass material of this invention (curve 5) is excessively low as compared with that in the thick-film resistor coated with conventional glass (curve 6) even if the resistivity itself is changed.

Figure 3:
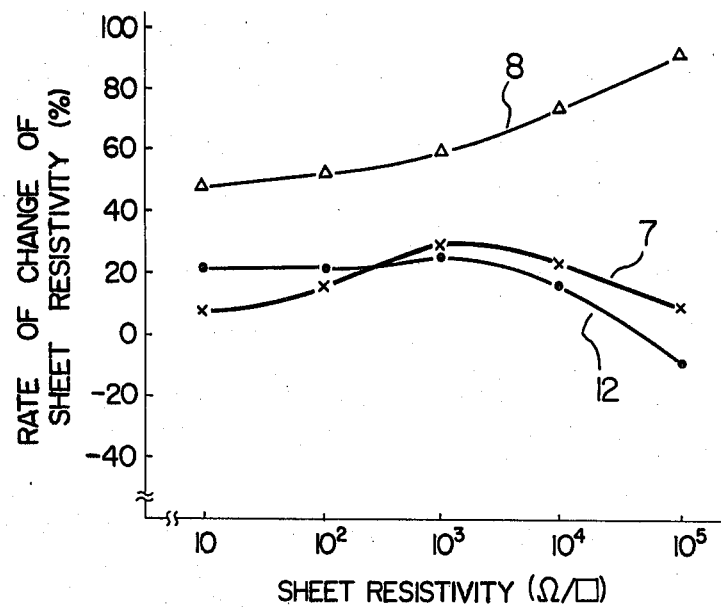

(III) When producing a multi-layer wiring board, the first layer thick-film resistor is repeatedly heated at a high temperature of the order of 900° C. So, the above-said wiring board was again heated at 900° C. for 10 minutes and the rate of change of sheet resistivity comparative to that before reheating was determined. The results are indicated by the curves 7 and 8 in FIG. 3, from which it is seen that the rate of change of sheet resistivity in the thick-film resistor coated with a glass material of this invention (curve 7) is kept amazingly low even if reheated as compared with that in the thick-film resistor coated with conventional glass (curve 8).

EXAMPLE 2

By following the procedure of (I) in Example 1, there were formed a first layer conductor 2a, first layer thick-film resistor 3a and insulating layer 4a on the ceramic substrate 1 of FIG. 1, and then a second layer conductor 2b and second layer thick-film resistor 3b were formed after the manner of Example 1 by using the same conductor paste and same RuO$_2$ resistor plate having a sheet resistivity of 10 Ω/□ to $10^5$ Ω/□ as used in Example 1.

In order to know how much the sheet resistivity of the thick-film resistor changes by the reaction of the second layer thick-film resistor with the underlying insulating layer during baking of said second layer thick-film resistor, the rate of change of sheet resistivity of the second layer thick-film resistor was determined from the following formula:

$$\text{Rate of change of sheet resistivity (\%)} = \frac{\begin{pmatrix}\text{sheet resistivity }(\Omega/\square)\\\text{of second layer thick-film resistor}\end{pmatrix} - \begin{pmatrix}\text{sheet resistivity }(\Omega/\square)\\\text{of thick-film resistor not coated with insulating layer on substrate}\end{pmatrix}}{\begin{pmatrix}\text{sheet resistivity }(\Omega/\square)\text{ of thick-film resistor not coated with insulating layer on substrate}\end{pmatrix}} \times 100$$

Figure 4:
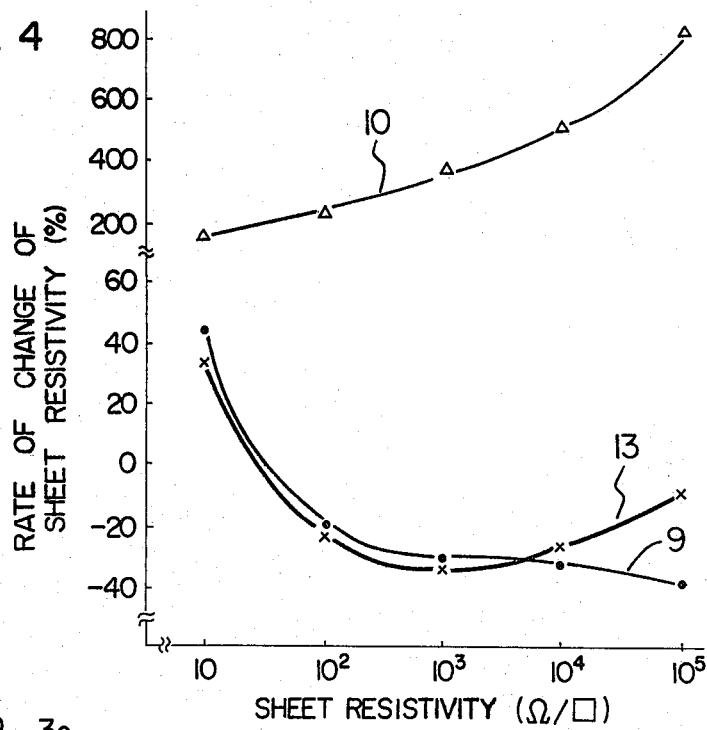

The results of determination were as indicated by the curves 9 and 10 in FIG. 4. It is noted that the rate of change of sheet resistivity is far lower in case of using a glass material of this invention (curve 9) for the insulating layer underlying the second layer thick-film resistor than in case of using the conventional glass (No. 4 in Table 4) (curve 10).

EXAMPLE 3

The first layer conductor 2a, first layer thick-film resistor 3a and insulating layer 4a were formed on the ceramic substrate 1 of FIG. 1 in the same way as in (I) of Example 1 except that the glass paste was made of ESL 4608 (No. 2 in Table 1) and that this paste was baked at 850° C. for 10 minutes, and the rate of change of sheet resistivity of said first layer thick-film resistor was determined after the manner of Example 1 to obtain the results shown through No. 2 in Table 1.

EXAMPLE 4

The first layer conductor 2, first layer thick-film resistor 3a and insulating layer 4a were formed on the ceramic substrate of FIG. 1 in the same way as in (I) of Example 1 except that ESL 4901-H$_5$ of No. 3 in Table 1 was used for the glass paste, and the rate of change of sheet resistivity of said first layer thick-film resistor was determined according to the formula of Example 1 to obtain the results shown through No. 3 in Table 1.

EXAMPLE 5

The first layer conductor 2a, first layer thick-film resistor 3a and insulating layer 4a were formed on the ceramic substrate 1 of FIG. 1 in the same way as in (II) of Example 1 except that a RuO$_2$ resistor paste having a sheet resistivity of 10 $\Omega/\square$ to 10$^5$ $\Omega/\square$ was used as resistor paste, that ESL 4901-H$_5$ of No. 3 in Table 1 was used for glass paste and that baking was performed at 900° C. for 10 minutes. The rate of change of sheet resistivity of said first layer thick-film resistor was determined in the same manner as in (II) of Example 1, obtaining the results indicated by curve 11 in FIG. 2. Also, the rate of change of sheet resistivity of said first layer thick-film resistor after 10-minute re-baking at 900° C. was determined according to (III) of Example 1 to obtain the results indicated by curve 12 in FIG. 3.

EXAMPLE 6

A two-layer wiring board of the type shown in FIG. 1 was produced in the same way as in Example 2 except that ESL 4901-H$_5$ of No. 3 in Table 1 was used for glass paste and that baking was performed at 900° C. for 10 minutes, and the rate of change of sheet resistivity of the second layer thick-film resistor was determined similarly to Example 2. The results were as indicated by curve 13 in FIG. 4.

EXAMPLE 7

Figure 5:
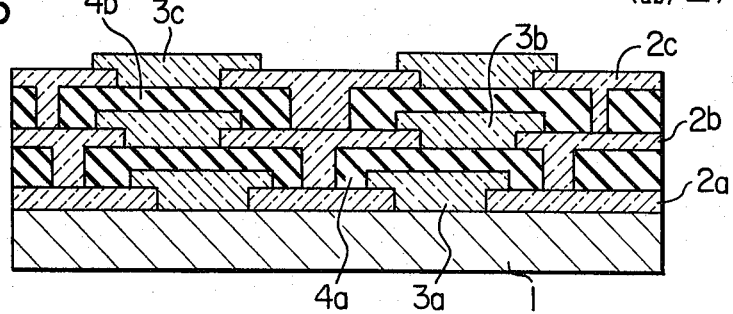

The two-layer wiring board of FIG. 1 was produced according to Example 2, and then an insulating layer 4b, third layer conductor 2c and uppermost layer thick-film resistor 3c were formed after the manner of Example 2 to obtain a three-layer wiring board as shown in FIG. 5. The first layer thick-film resistance was subjected to 5 times of 10-minute heating at 900° C. and the second layer thick-film resistance underwent three times of 10-minute heating at 900° C. Even after such repeated heating, the rate of change of sheet resistivities of the first layer thick-film resistor 3a and second layer thick-film resistor 3b were far lower than those of the insulating layers 4a and 4b using the glass material of No. 4 in Table 1.

Thus, according to this invention, the change of sheet resistivity of the thick-film resistor is smaller than that in the products using prior art glass no matter in which layer the thick-film resistor is formed.

What is claimed is:

1. In a thick-film multi-layer wiring board which comprises a substrate, a first resistor circuit comprising a thick film conductor and a thick film resistor, said first resistor circuit being provided on the substrate, a first insulating layer with through-holes being provided on the first resistor circuit, a second resistor circuit comprising a thick film conductor and a thick film resistor being provided on the first insulating layer and being connected to the first resistor circuit through said through-holes, an improvement which comprises forming the first insulating layer of crystallized glass of BaO-ZnO-MgO-Al$_2$O$_3$-TiO$_2$-SiO$_2$-B$_2$O$_3$ system, crystallized at 850° C. or above, which crystallized glass is sparingly reactive to the binder glass of the resistor circuits, whereby rate of change of resistivity of the thick film resistor is reduced.

2. A thick-film multi-layer wiring board according to claim 1, wherein said second resistor circuit has at least one insulating layer with through-holes on said second resistor circuit and one resistor circuit on said at least one insulating layer, said one resistor circuit being connected to the underlying resistor circuits through the through-holes of the at least one insulating layer.

3. A thick-film multi-layer wiring board according to claim 1 or 2, wherein said first resistor circuit and said second resistor circuit consist of the thick film conductor and the thick film resistor.

4. A thick-film multi-layer wiring board according to claim 1, wherein the thick film resistor is composed of conductive RuO$_2$ and PbO-ZnO-Al$_2$O$_3$-SiO$_2$-B$_2$O$_3$ glass.

5. A thick-film multi-layer wiring board according to claim 1, wherein the thick film resistor is composed of conductive RuO$_2$ and PbO-CdO-Al$_2$O$_3$-SiO$_2$-B$_2$O$_3$ glass.

6. A thick-film multi-layer wiring board according to claim 1, wherein the thick film resistor is composed of conductive $Bi_2Ru_2O_7$ and $PbO-ZnO-Al_2O_3-SiO_2-B_2O_3$ glass.

7. A thick-film multi-layer wiring board according to claim 1, wherein the thick film resistor is composed of conductive $Bi_2Ru_2O_7$ and $PbO-CdO-Al_2O_3-SiO_2-B_2O_3$ glass.

8. A thick-film multi-layer wiring board according to claim 2, wherein the at least one insulating layer is made of said crystallized glass.

9. In a thick-film multi-layer wiring board which comprises a substrate, a first resistor circuit comprising a thick film conductor and a thick film resistor, said first resistor circuit being provided on the substrate, a first insulating layer with through-holes being provided on the resistor circuit, a second resistor circuit comprising a thick film conductor and a thick film resistor being provided on the first insulating layer and being connected to the first resistor circuit through said through-holes, an improvement which comprises forming the first insulating layer of crystallized glass of $PbO-CaO-MgO-Al_2O_3-SiO_2-B_2O_3$ system, $Al_2O_3$ and $CaZrO_3$, crystallized at 850° C. or above, which crystallized glass is sparingly reactive to the binder glass of the resistor circuits, whereby rate of change of resistivity of the thick film resistor is reduced.

10. A thick-film multi-layer wiring board according to claim 9, wherein said second resistor circuit has at least one insulating layer with through-holes on said second resistor circuit and one resistor circuit on said at least one insulating layer, said one resistor circuit being connected to the underlying resistor circuits through the through-holes of the at least one insulating layer.

11. A thick-film multi-layer wiring board according to claim 9 or 10, wherein said first resistor circuit and said second resistor circuit consist of the thick film conductor and the thick film resistor.

12. A thick-film multi-layer wiring board according to claim 9, wherein the thick film resistor is composed of conductive $RuO_2$ and $PbO-ZnO-Al_2O_3-SiO_2-B_2O_3$ glass.

13. A thick-film multi-layer wiring board according to claim 9, wherein the thick film resistor is composed of conductive $RuO_2$ and $PbO-CdO-Al_2O_3-SiO_2-B_2O_3$ glass.

14. A thick-film multi-layer wiring board according to claim 9, wherein the thick film resistor is composed of conductive $Bi_2Ru_2O_7$ and $PbO-ZnO-Al_2O_3-SiO_2-B_2O_3$ glass.

15. A thick-film multi-layer wiring board according to claim 9, wherein the thick film resistor is composed of conductive $Bi_2Ru_2O_7$ and $PbO-CdO-Al_2O_3-SiO_2-B_2O_3$ glass.

16. A thick-film multi-layer wiring board according to claim 10, wherein the at least one insulating layer is made of said crystallized glass.

17. In a thick-film multi-layer wiring board which comprises a substrate, a first resistor circuit comprising a thick film conductor and a thick film resistor, said first resistor circuit being provided on the substrate, a first insulating layer with through-holes being provided on the first resistor circuit, a second resistor circuit comprising a thick film conductor and a thick film resistor being provided on the first insulating layer and being connected to the first resistor circuit through said through-holes, an improvement which comprises forming the first insulating layers of amorphous glass of $PbO-Cao-Al_2O_3-SiO_2-B_2O_3$ system, and at least one of $Al_2O_3$ and $SiO_2$, softened at 750° C. or above, which amorphous glass is sparingly reactive to the binder glass of the resistor circuits, whereby rate of change of resistivity of the thick film resistor is reduced.

18. A thick-film multi-layer wiring board according to claim 17, wherein said second resistor circuit has at least one insulating layer with through-holes on said second resistor circuit and one resistor circuit on said at least one insulating layer, said one resistor circuit being connected to the underlying resistor circuits through the through-holes of the at least one insulating layer.

19. A thick-film multi-layer wiring board according to claim 17 or 18, wherein said first resistor circuit and said second resistor circuit consist of the thick film conductor and the thick film resistor.

20. A thick-film multi-layer wiring board according to claim 17, wherein the thick film resistor is composed of conductive $RuO_2$ and $PbO-ZnO-Al_2O_3-SiO_2-B_2O_3$ glass.

21. A thick-film multi-layer wiring board according to claim 17, wherein the thick film resistor is composed of conductive $RuO_2$ and $PbO-CdO-Al_2O_3-SiO_2-B_2O_3$ glass.

22. A thick-film multi-layer wiring board according to claim 17, wherein the thick film resistor is composed of conductive $Bi_2Ru_2O_7$ and $PbO-ZnO-Al_2O_3-SiO_2-B_2O_3$ glass.

23. A thick-film multi-layer wiring board according to claim 17, wherein the thick film resistor is composed of conductive $Bi_2Ru_2O_7$ and $PbO-CdO-Al_2O_3-SiO_2-B_2O_3$ glass.

24. A thick-film multi-layer wiring board according to claim 18, wherein the at least one insulating layer is made of said amorphous glass.

* * * * *